United States Patent [19]
Ayata et al.

[11] Patent Number: 4,663,534
[45] Date of Patent: May 5, 1987

[54] POSITION DETECTING DEVICE UTILIZING SELECTIVE OUTPUTS OF THE PHOTODETECTOR FOR ACCURATE ALIGNMENT

[75] Inventors: Naoki Ayata, Machida; Takashi Matsumura, Yokohama, both of Japan

[73] Assignee: Canon Kabushiki Kaisha, Tokyo, Japan

[21] Appl. No.: 707,864

[22] Filed: Mar. 4, 1985

[30] Foreign Application Priority Data

Mar. 8, 1984 [JP] Japan .................................. 59-42821
Mar. 8, 1984 [JP] Japan .................................. 59-42822
Mar. 8, 1984 [JP] Japan .................................. 59-42823
Mar. 8, 1984 [JP] Japan .................................. 59-42824
Mar. 8, 1984 [JP] Japan .................................. 59-42825
May 11, 1984 [JP] Japan .................................. 59-92895

[51] Int. Cl.[4] .................... G01N 21/86; G01V 9/04
[52] U.S. Cl. .................................. 250/548; 250/557; 356/401
[58] Field of Search .............................. 250/548, 557; 356/399–401

[56] References Cited

U.S. PATENT DOCUMENTS

| 3,739,247 | 6/1973 | Yamaguchi et al. | 356/400 |
| 3,885,877 | 5/1975 | Horwath et al. | 356/400 |
| 4,112,309 | 9/1977 | Nakazawa et al. | 250/560 |
| 4,200,395 | 4/1980 | Smith et al. | 356/400 |
| 4,402,610 | 9/1983 | Lacombat | 356/400 |
| 4,515,481 | 5/1985 | Yamada et al. | 356/401 |
| 4,553,845 | 11/1985 | Kuroki et al. | 356/400 |
| 4,563,094 | 1/1986 | Yamada | 356/400 |

Primary Examiner—David C. Nelms
Assistant Examiner—S. Allen
Attorney, Agent, or Firm—Fitzpatrick, Cella, Harper & Scinto

[57] ABSTRACT

A position detecting device including a photodetector having a plurality of light-receiving sections. For the position detection, an appropriate one or ones of the light-receiving sections are selectable, whereby an alignment accuracy and an alignment speed relative to two objects having alignment marks.

7 Claims, 17 Drawing Figures

POSITION DETECTING DEVICE UTILIZING SELECTIVE OUTPUTS OF THE PHOTODETECTOR FOR ACCURATE ALIGNMENT

BACKGROUND OF THE INVENTION

This invention relates to a position detecting device and, more particularly, to a position detecting device usable with a semiconductor exposure apparatus, for detecting at a high accuracy the position of each of alignment marks formed on a mask and a wafer to permit accurate alignment between the mask and wafer prior to tranferring an integrated circuit pattern of the mask onto the wafer. The invention also relates to an alignment system including a position detecting device as above for aligning a mask with a wafer. Hereinafter, the alignment mark formed on the mask will be referred to as "mask alignment mark" and the alignment mark formed on a wafer will be referred to as "wafer alignment mark". Also, in this specification, the word "mask" is comprehensive of a reticle as well as a mask.

Many types of conventional exposure apparatuses for use in the manufacture of semiconductor circuit devices employ arrangement for detecting, through laser beam scanning, the positions of the mask alignment mark and wafer alignment mark in order to achieve alignment between the mask and wafer. According to one of such position detecting techniques, the mask and wafer which have been coarsely aligned with each other are optically scanned and then the light beam scatteringly reflected from the alignment marks is detected by a photodetector in a time series manner, whereby the positional information on the marks is converted into the information with respect to time.

In such case, however, the light beams scatteringly reflected by the wafer alignment mark are liable to be affected by a photoresist layer applied to the surface of the wafer, whereby the accuracy of position detecting is disadvantageously deteriorated. Such deterioration of detecting accuracy is chiefly because of the prism action of the photoresist layer, as is known in the art.

SUMMARY OF THE INVENTION

It is accordingly a primary object of the present invention to provide an improved position detecting device capable of detecting the position of a target quickly and at a higher precision.

Briefly, according to the present invention, there is provided a position detecting device including a photodetector having a plurality of lightreceiving sections. For the position detection, an appropriate one or ones of the light-receiving sections are selectable, whereby an alignment accuracy and an alignment speed relative to two objects having alignment marks are improved.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figures 1A, 1B:
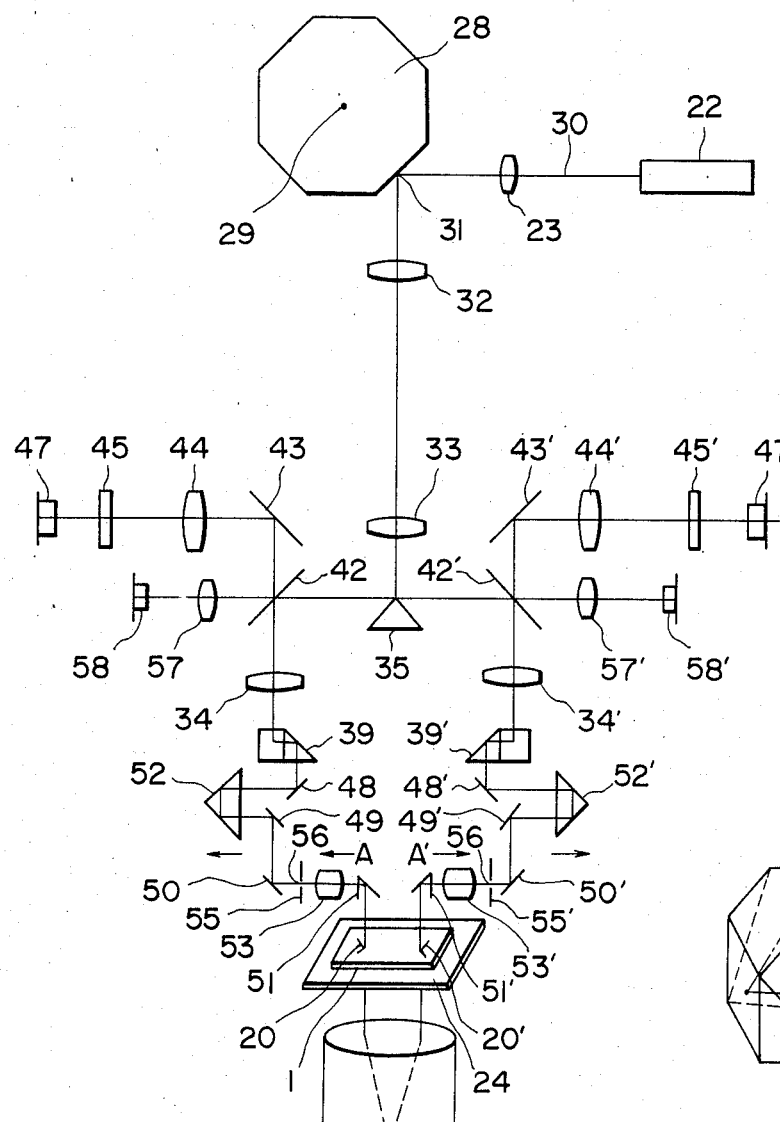
FIG. 1A is a schematic view showing an exposure apparatus to which a position detecting device according to an embodiment of the present invention is applied.
FIG. 1B is a perspective view showing a prism block which is one of the major components of the exposure apparatus of FIG. 1A.

FIG. 1A shows a major portion of a projection exposure apparatus for reductively projecting, through a projection optical system, a pattern of a mask onto a wafer, i.e. a step-and-repeat type exposure apparatus, called a stepper.

As shown in FIG. 1A, a mask 1 having formed thereon an integrated circuit pattern and alignment marks 20 and 20' is held by a mask stage 24. The circuit pattern of the mask 1 is projected by a reduction projection lens 3 onto a wafer 4 having a sensitive coating and alignment marks 21 and 21'. The wafer 4 is held by a wafer stage 5. Each of the mask stage 24 and wafer stage 5 is movable in the directions of X, Y and θ (rotational direction).

For example, the step-and-repeat movement is carried out by displacement of the wafer stage 5 in the directions of X and Y, initial positioning of the mask 1 relative to the exposure apparatus is carried out by displacement of the mask stage 24 in the directions of X, Y and θ, and the alignment between the mask 1 and wafer 4 is carried out by displacement of the mask stage 24 in the directions of X and Y and by displacement of the wafer stage 5 in the direction of θ. Of course, the alignment may be achieved only by the displacement of the mask stage in the directions of X, Y and θ, or only by the displacement of the wafer stage.

In FIG. 1A, the wafer 4 is provided with a pair of alignment marks 21 and 21'. This is, however, only for the sake of illustration, and actually the wafer 4 has formed thereon pairs of alignment marks corresponding to the number of exposure shots.

In the present embodiment, the dimensional relation between each of the alignment marks 20 and 20' on the mask 1 and each of the alignment marks 21 and 21' on the wafer 4 is such that the size of the aligment mark 20 or 20' on the mask 1 divided by the size of the alignment mark 21 or 21' on the wafer 4 becomes equal to the reduction ratio of the projection lens 3.

Denoted by a reference numeral 28 is a polygonal mirror which is rotatable about a rotational shaft 29. A laser source 22 emits a laser beam 30 which is focused by a lens 23 onto a point 31 on the surface of the polygonal mirror 28.

The exposure apparatus further includes relay lenses 32, 33 and 34, and a triangular prism 35 having its appex coincident with the common optical axis of the lenses 32 and 33. Thus, the prism 35 is effective to divide each scanning operation by the laser beam 30 scanningly deflected by the polygonal mirror 28 into the first and second halves, i.e. the right-hand side half and the left-hand side half. A prism block 39 is provided to convert scanning in the X direction (the direction contained in the sheet of the drawing) of the laser beam 30 into scanning in the Y direction (the direction perpendicular to the sheet of the drawing), and has a construction such as illustrated in FIG. 1B. A half mirror 42 is provided to define a photoelectric detecting system comprising a mirror 43, a lens 44, a spatial filter 45, and a photodetector 47. Disposed behind the prism block 39 and along the optical axis are total reflection mirrors 48, 49, 50 and 51, a prism 52 and an $f-\theta$ objective lens 53.

The exposure apparatus further includes a condenser lens 57 and a photodetector 58 for detecting a synchronization signal. A portion of the laser beam incident on the half mirror 42 passes therethrough and enters into the condenser lens 57. By the condenser lens 57, the portion of the laser beam is converged and is incident on the photodetector 58. Thus, the photodetector 58 is effective to detect the originating point and terminating point of the laser beam scanning.

It will be seen from the drawing that the signal detecting device of the exposure apparatus of FIG. 1A comprises left-hand side and right-hand side signal detecting systems which are fully symmetric each other. Hereinafter, the signal detecting system including elements designated by reference numerals with primes will be referred to as "right-hand side signal detecting system", while the signal detecting system including elements denoted by reference numerals without prime will be referred to as "left-hand side signal detecting system". In the right-hand side signal detecting system, elements corresponding to those in the left-hand side signal detecting system are denoted by corresponding reference numerals with primes.

The relay lenses 32–34 form a deflection origin of the polygonal mirror 28 at a position of a pupil 56 of a stop 55 for the objective lens 53. As the result, the mask 1 surface and the wafer 4 surface are scanned by the laser beam of sheet-like shape or spot-like shape with the rotation of the polygonal mirror 28.

Figure 2:
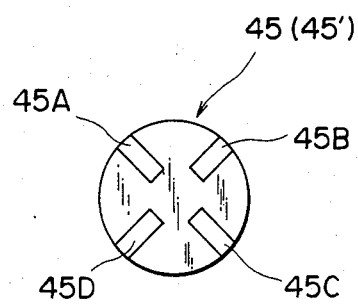
FIG. 2 is a plan view showing a filter used in the position detecting device according to an embodiment of the present invention.

Referring to FIG. 2 which is a plan view of the spatial filter 45 (or 45'), the filter includes light-transmitting sections 45A, 45B, 45C and 45D. The remaining area of the filter 45 is a light-intercepting portion. The light-transmitting sections 45A–45D are disposed equiangularly with respect to the center of the filter, so that an angle of 90 degrees is defined between two adjacent light-transmitting sections. As will be described later, the diagonally and orthogonally intersecting positional relation is selected in accordance with the directions of edges of the alignment marks.

Figure 3A:
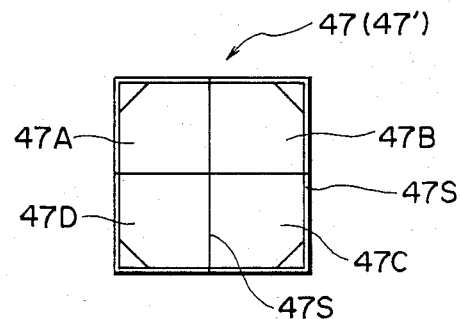
FIG. 3A is a plan view showing a photodetector used in the position detecting device according to an embodiment of the present invention.

FIG. 3A is a plan view of the photodetector 47 (or 47'). The photodetector 47 includes light-receiving elements or sections 47A, 47B, 47C and 47D which are independent from each other. The light-receiving elements 47A–47D are electrically isolated from each other by means of a channel stopper 47S 47S, so that each of the light-receiving elements 47A–47D can detect a photo-current independently from the other. The light-receiving elements 47A–47D are formed on the same chip and are housed in an unshown metallic package having a light-transmitting portion.

The photodetector 47 shown in FIG. 3A is disposed relative to the spatial filter 45 shown in FIG. 2 in such manner that each of the orthogonally intersecting elements of the channel stopper 47S of the photodetector 47 defines an angle of 45 degrees relative to each of two adjacent light-transmitting sections 45A–45D. That is, the light beam transmitted through the light-transmitting section 45A, for example, is incident on the light-receiving element 47A. Similarly, the light-transmitting sections 45B, 45C and 45D correspond respectively to the light-receiving elements 47B, 47C and 47D.

Figure 3B:
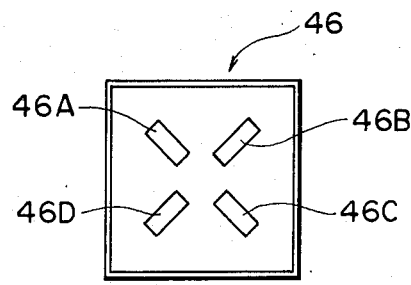
FIG. 3B is a plan view showing a photodetector used in the position detecting device according to another embodiment of the present invention.

FIG. 3B shows a modified form of photodetector. This photodetector 46 includes light-receiving elements or sections 46A, 46B, 46C and 46D shaped similarly to those of the light-transmitting sections of the spatial filter 45. With such arrangement, only the light beams entering the lightreceiving elements 46A–46D are detected. In other words, any light beam incident on the area of the photodetector 46 other than the light-receiving elements 46A–46D is not detected by the photodetector 46. Thus, the photodetector 46 functions also as a spatial filter. Therefore, the spatial filter 45 of FIG. 2 is no longer necessary. The photodetector 46 of FIG. 3B is accordingly disposed immediately after the lens 44 shown in FIG. 1.

Figure 4A:
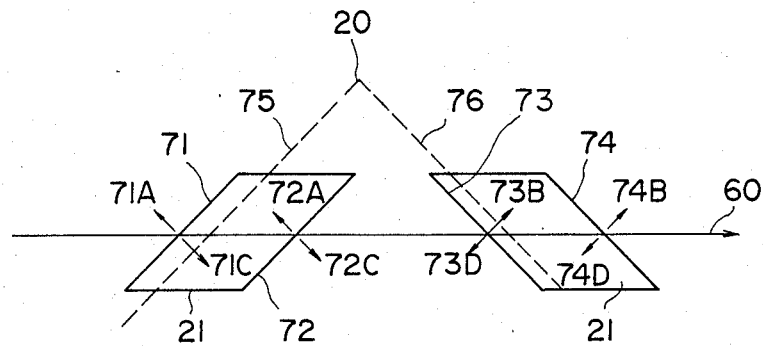
FIG. 4A is an enlarged plan view showing wafer and mask alignment marks when they are scanned by a scanning laser beam.

FIG. 4A is a plan view showing a wafer alignment mark formed on the wafer 4 surface and a mask alignment mark projected, through the reduction projection lens, onto the wafer 4 surface. In FIG. 4A, only the alignment marks to be detected by the left-hand side detecting system, i.e. the wafer alignment mark 21 and mask alignment mark 20, are illustrated. The mask alignment mark 20 comprises two bars 75 and 76 disposed at a right angle relative to each other. On the other hand, the wafer alignment mark 21 comprises two mark elements disposed at a right angle relative to each other, each mark element having parallel edges 71 and 72 (or 73 and 74) defined by stepped portions as will be described later with reference to FIG. 4B or 4C. When the wafer alignment mark 21 is scanned by a laser beam in the direction as denoted by an arrow 60 in FIG. 4A, the scanning laser beam is diffracted by the edges 71, 72, 73 and 74, and the diffracted rays advance in the directions orthogonal to the directions of the edges, such as denoted by arrows 71A and 71C; 72A and 72C; 73B and 73D; and 74B and 74D.

The inclination of the surface of the resist coating formed on the wafer surface differs, depending on whether the wafer alignment mark is defined by a protrudent pattern formed on the wafer surface or by a caved pattern formed in the wafer surface. Depending on the difference in inclination of the surface of the resist coating, the direction of advancement of the light ray reflected from the surface of the resist coating at a position near the edge of the wafer alignment mark and the direction of advancement of the light ray reflected from the wafer surface and refracted by the resist layer are variable.

Figure 4B:
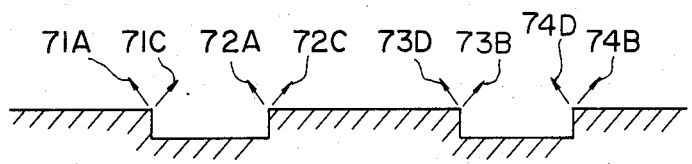
FIG. 4B is a sectional view schematically showing a wafer alignment mark defined by a caved pattern.
Figure 4C:
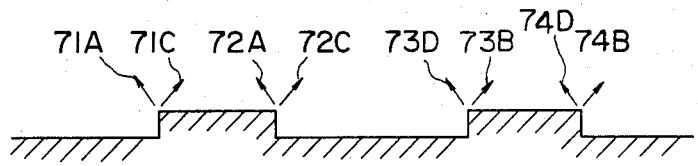
FIG. 4C is a sectional view schematically showing a wafer alignment mark defined by a protrudent pattern.

FIG. 4B is a sectional view schematically showing the wafer alignment mark where it is formed by the caved pattern, while FIG. 4C is a sectional view schematically showing the wafer alignment mark where it is formed by the protrudent pattern.

As is shown in FIG. 4B, the diffraction light generated by the edge 71 (FIG. 4A) contains components as denoted by arrows 71A and 71C which are directed oppositely as viewed in FIG. 4A. The reflected light component 71A contains, as well as the purely diffracted rays generated by the edge and the reflected light rays from the surface of the resist coating, the light rays reflected from the bottom portion of the caved pattern and refracted by the prism action of the resist coating.

Figure 4D:
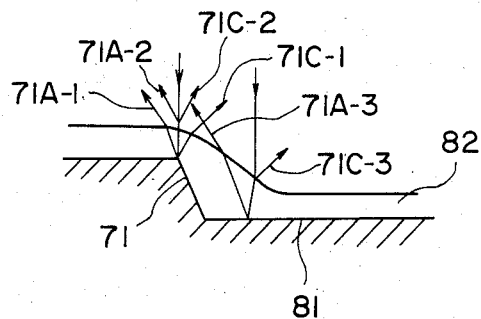
FIG. 4D is a sectional view showing reflection of the scanning laser beam chiefly at an edge of a stepped portion on the wafer.

This will be described in more detail with reference to an enlarged view of FIG. 4D. In this Figure, reference numeral 81 denotes a wafer substrate coated with a photoresist layer 82. Also, reference numeral 71 denotes a stepped portion defined between the wafer substrate 81 and the edge of the alignment mark.

The light rays reflected from the stepped portion 71 includes diffracted rays 71A-1 and 71C-1 caused by the edge of the alignment mark and the reflected rays 71A-2, 71C-2 and 71C-3 from the surface of the resist coating. Among these light rays, the proportion of the reflected rays from the surface of the resist coating is very small, such as approx. 4% of the total of the reflected light.

On the other hand, the reflected light affected by the prism action of the resist coating and directed to be mixed into the diffracted light is a light beam 71A-3 which is defined by a light beam incident on the resist layer 82, refracted thereby, reflected by the wafer surface 81 and refracted again by the resist layer 82. This refractively reflected light beam 71A-3 emerges from a point close to the stepped portion 71 so that it is mixed into the diffracted light caused by the edge of the alignment mark. When the refractively reflected light beam 71A-3 is incident on the photodetector, the detection accuracy with respect to the edge of the alignment mark is deteriorated. Particularly, if the wafer is made of aluminum or the like having a high reflection factor, the effect of the refractively reflected light is significant so that the alignment accuracy is degraded remarkably. In view of this, according to the present invention, when the position of the edge of the stepped portion 71 is to be detected, only the light rays advancing in the direction of 71C are detected, whereas the light rays advancing in the direction of 71A are blocked or disregarded. By this, the light beam 71A-3 caused by the prism action of the resist layer 82 does not enter the photodetector or is not used for the purpose of position detection, whereby the position detection accuracy is improved.

With respect to the edge 72 (FIG. 4A) when it is defined by a stepped portion of the caved pattern shown in FIG. 4B, the reflected light beam affected by the prism action of the resist layer is included in the reflected light component directed in the direction as denoted by an arrow 72C. Therefore, only the light rays advancing in the direction of arrow 72A are detected or used for the purpose of position detection.

In summary, when the laser beam 60 in FIG. 4A scans the wafer alignment mark in the direction from the left to the right, the light beams advancing in the directions of arrows 71C, 72A, 73B and 74D are detected in a case where the wafer alignment mark is provided by the caved pattern of FIG. 4B, while the light beams advancing in the directions of arrows 71A, 72C, 73D and 74B are detected in a case where the wafer alignment mark is provided by the protrudent pattern of FIG. 4C. The light beams advancing in these directions correspond to the light-transmitting sections of the spatial filter 45 shown in FIG. 2 in the manner such as shown in the following Table 1.

TABLE 1

| TRANSMITTING SECTION | CAVED-PATT. | PROTRUDENT-PATT. |
| --- | --- | --- |
| 45A | 72A | 71A |
| 45C | 71C | 72C |
| 45B | 73B | 74B |
| 45D | 74D | 73D |

Accordingly, when the caved pattern of FIG. 4B is scanned by the laser beam in the direction from the left to the right, the light-transmitting sections of the spatial filter are selectively used in the sequence of 45C, 45A, 45B and 45D (in the named order); whereas, when the protrudent pattern of FIG. 4C is to be scanned by the laser beam, the light-transmitting sections of the spatial filter are selectively used in the sequence of 45A, 45C, 45D and 45B (in the named order).

Figure 5A:
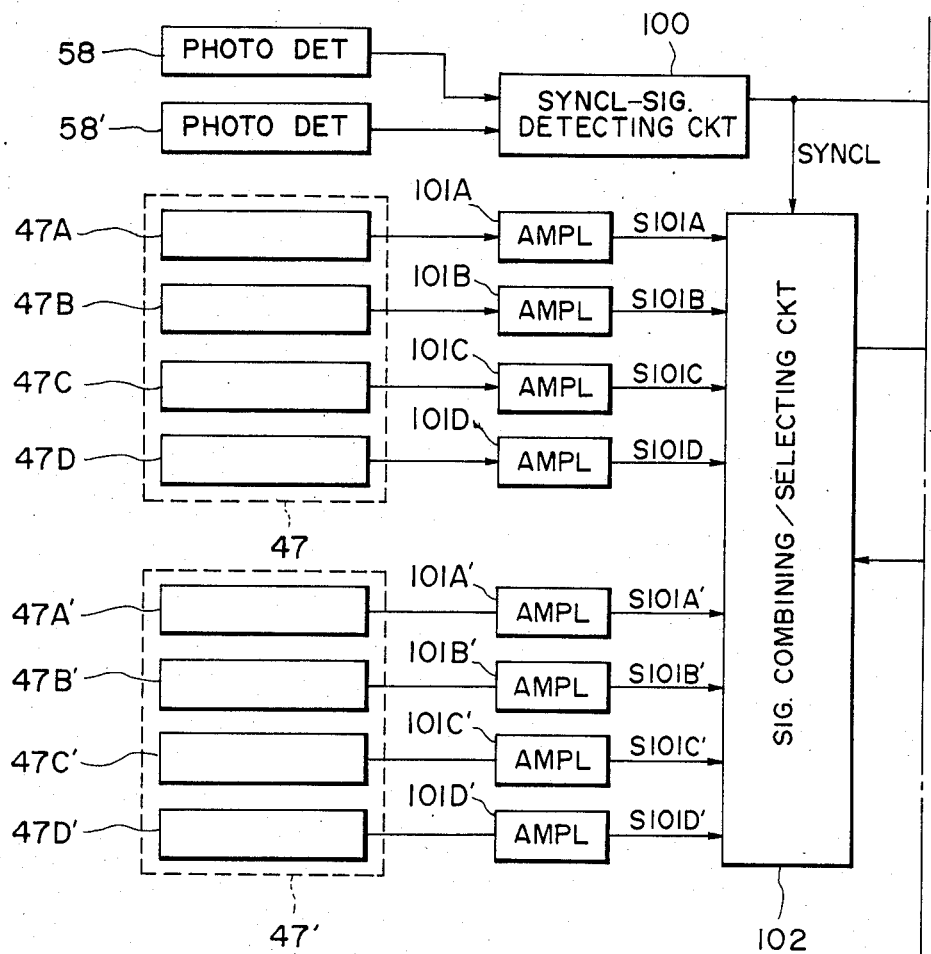
FIG. 5A and 5B are diagrams showing a signal processing circuit of a position detecting device according to the present invention.
Figure 5:
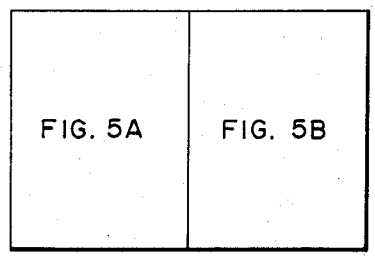
Figure 5B:
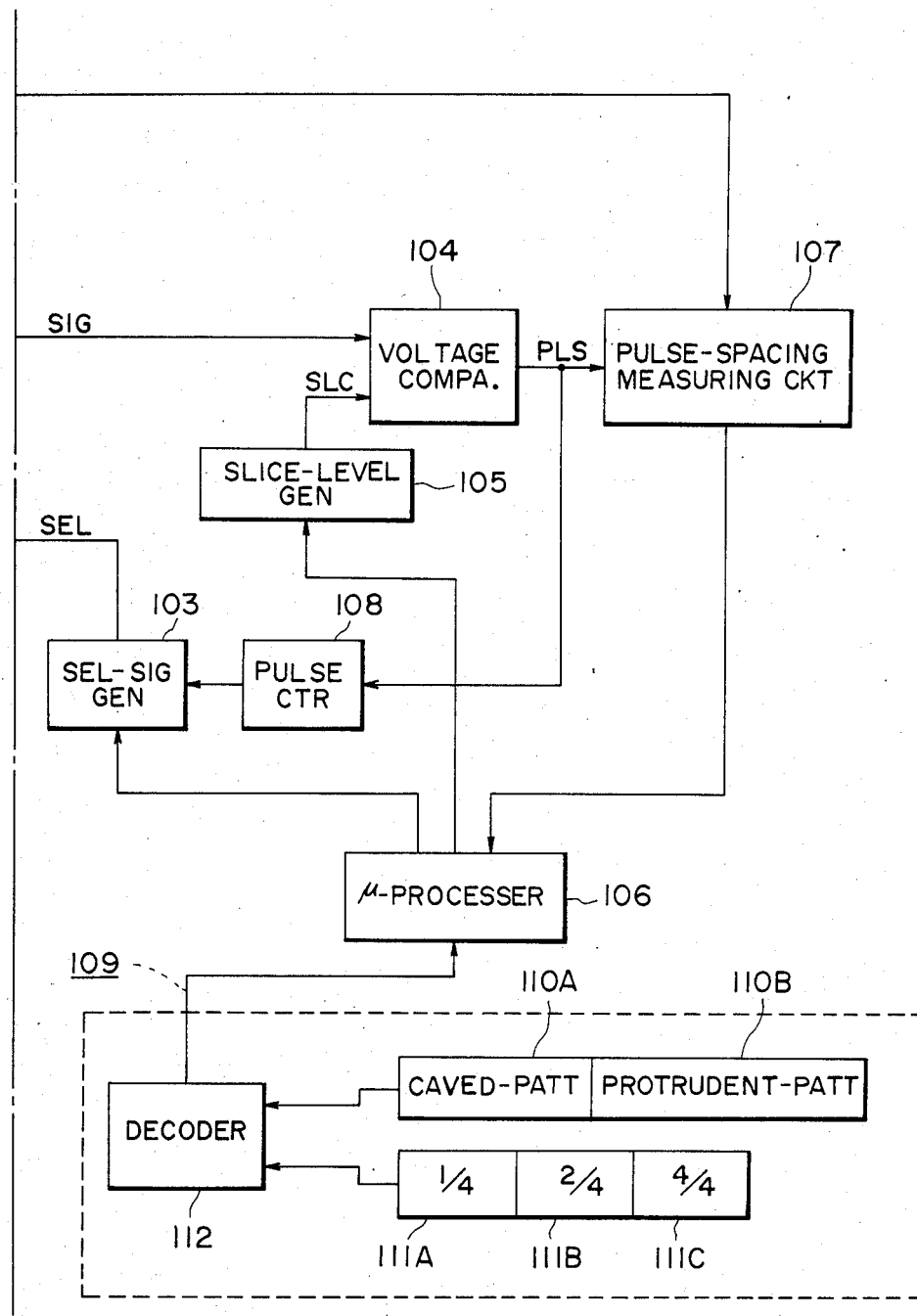

FIG. 5 is a block diagram showing a signal processing circuit, of the position detecting device according to one embodiment of the present invention, for effecting the above-described selection of the light-transmitting sections of the spatial filter and therefore the selection of the light-receiving elements of the photodetector to achieve the position detection. Denoted in this Figure by reference numerals 47, 47', 58 and 58' are the photodetector of the left-hand side detecting system, the photodetector of the right-hand side detecting system, the synchronization signal detector of the left-hand side detecting system, and the synchronization signal detector of the light-hand side detecting system, respectively, shown in FIG. 1. Each of the photodetectors 47 and 47' comprises four light-receiving sections 47A–47D (or 47A'–47D'), such as shown in FIG. 3A. The outputs in the form of photo-current produced by these light-receiving sections are supplied respectively to amplifiers 101A–101D, 101A'–101D', wherein current-to-voltage conversion and amplification are carried out.

Figure 6:
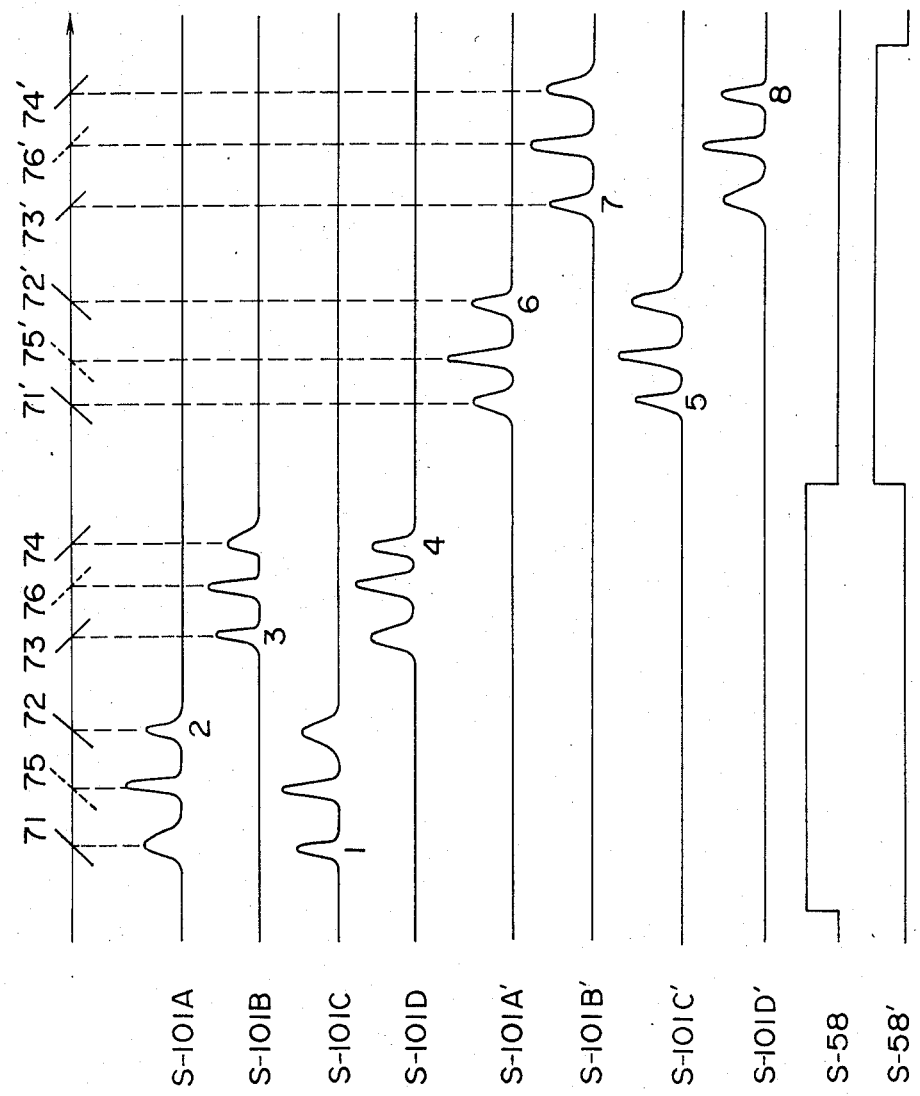
FIG. 6 shows waveforms obtainable with a photodetecting system in a position detecting device according to the present invention.

When the edges and bars 71, 75, 72, 73, 76 and 74 of the wafer alignment mark and mask alignment mark to be detected by the left-hand side detecting system and the edges and bars 71', 75', 72', 73', 76' and 74' (see FIG. 6) of the wafer alignment mark and mask alignment mark to be detected by the right-hand side detecting system are scanned by the laser beam, the amplifiers 101A–101D and 101A'–101D' and the synchronization signal detectors 58 and 58' produce respectively output signals S101A, S101B, S101C, S101D, S101A', S101B', S101C', S101D', S58 and S58', such as shown in FIG. 6. These waveforms are obtainable in a time series manner.

Among these output signals, those produced by the amplifiers 101A–101D and 101A'–101D' are applied to a signal combining/selecting circuit 102. The output signals from the synchronization signal detecting photodetectors 58 and 58' are applied to a synchronization signal detecting circuit 100. The signal combining-/selecting circuit 102 is controlled by an output signal SYNCL of the synchronization signal detecting circuit 100 and by an output signal SEL of a selection signal generating circuit 103.

Figures 7, 7B:
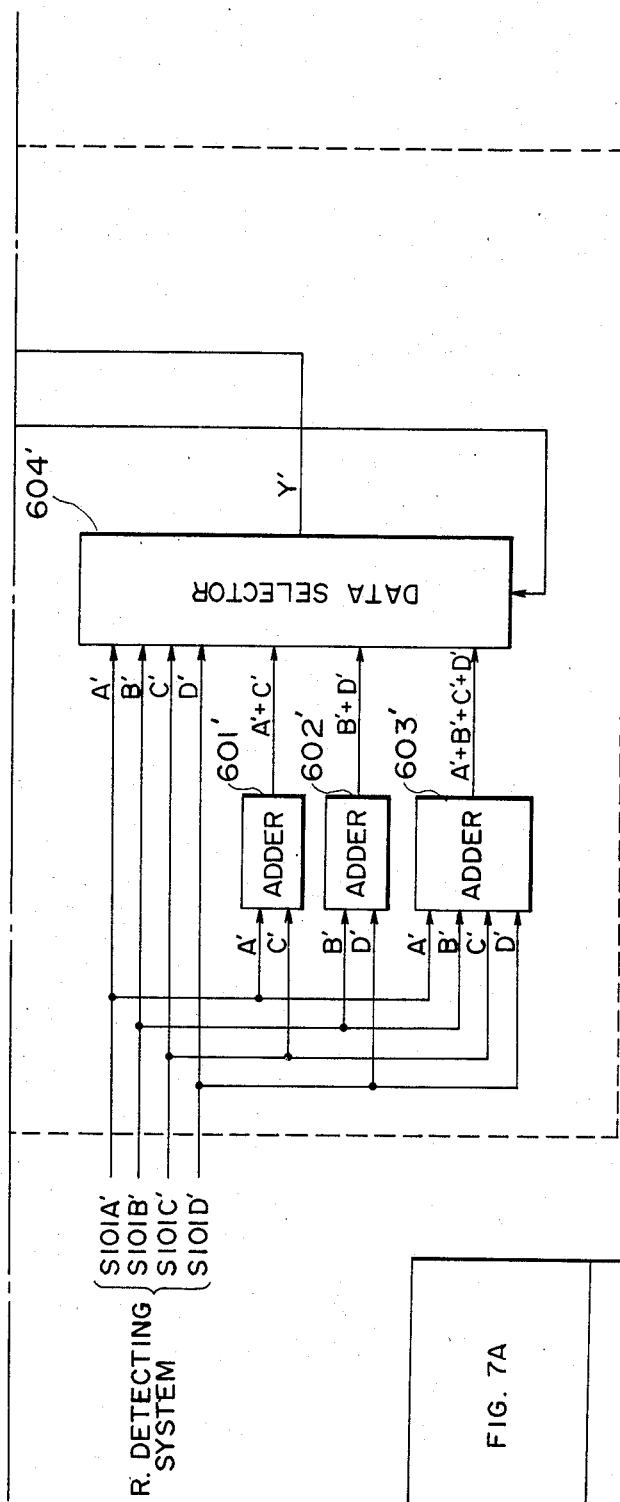
FIG. 7 is a diagram showing details of a signal combining/selecting circuit shown in FIG. 5.
Figure 7A:
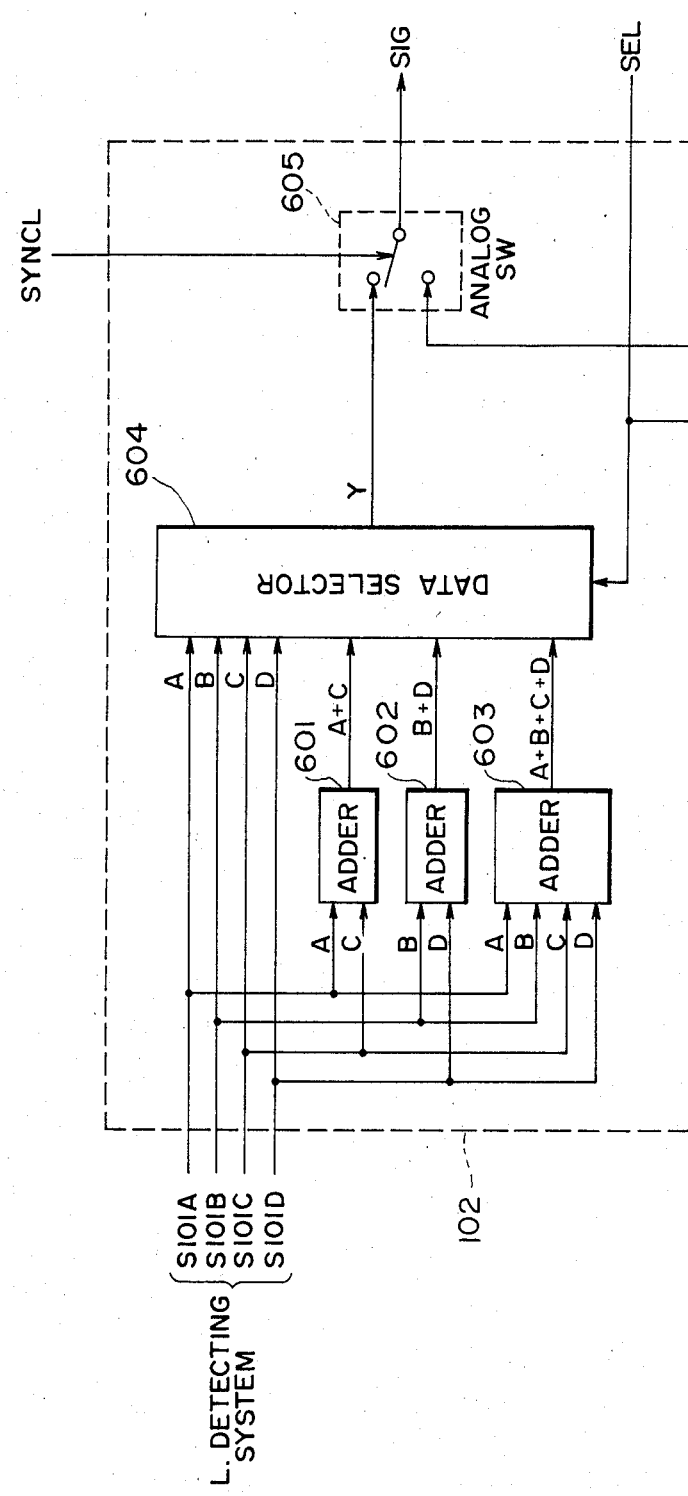

Details of the signal combining/selecting circuit 102 are illustrated in FIG. 7. In this Figure, the alignment signals S101A, S101B, S101C and S101D as detected by the left-hand side detecting system are directly applied to an analog data selector 604 as input signals A, B, C and D. On the other hand, there are provided an adder 601 for adding in an analog fashion the signals S101A and S101C; an adder 602 for adding in an analog fashion the signals S101B and S101D; and an adder 603 for adding in an analog fashion the signals S101A, S101B, S101C and S101D. After the signal combination by these adders 601-603, the resultant signals "A+C", "B+D" and "A+B+C+D" are supplied to the data selector 604.

The data selector 604 is of a type selecting one of seven inputs and is controlled by a selection signal SEL in the form of 3-bits supplied thereto from the selection signal generating circuit 103. The output Y of the data selector 604 is connected to one of input terminals of an analog switch 605.

On the other hand, the right-hand side detecting system processes signals in a similar manner as the left-hand side detecting system. In the right-hand side detecting system, elements and signals corresponding to those in the left-hand side detecting system are denoted by corresponding reference numerals with primes. An output signal Y' of a data selector 604' of the right-hand side detecting system is connected to the other of the input terminals of the analog switch 605. The analog switch 605 is controlled by a synchronization signal SYNCL of the left-hand side detecting system produced by the synchronization signal detecting circuit 100. That is, the analog switch 605 is arranged to select the output signal Y from the data selector 604 when the synchronization signal SYNCL of the left-hand side detecting system is active, while it selects the output signal Y' from the data selector 604' when the synchronization signal SYNCL is not active.

One of the output signals Y and Y' of the left-hand side and right-hand side detecting systems as selected by the analog switch 605 is supplied as an alignment signal SIG to the voltage comparator 104 shown in FIG. 5.

Referring back to FIG. 5, the voltage comparator 104 compares the output signal SIG from the signal combining/selecting circuit 102 with an output voltage SLC from a slice level generating circuit 105. The slice level generating circuit 105 is arranged to effect digital-to-analog conversion relative to the digital data supplied thereto from a microprocessor 106 and generate a slice voltage SLC for the autoalignment signal SIG. The voltage comparator 104 compares the alignment signal SIG with the slice voltage SLC and binarizes the alignment signal SIG.

Figure 8:
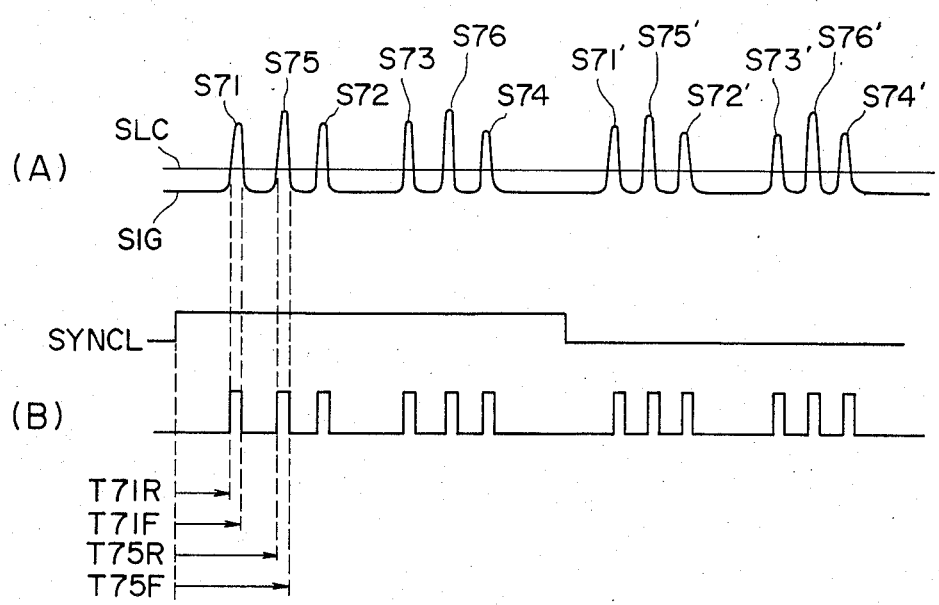
FIG. 8 illustrates operation of a voltage comparing circuit in a position detecting device according to the present invention.

FIG. 8 is a waveform view for illustrating the operation of the voltage comparator 104. Part (A) of FIG. 8 shows the alignment signal SIG having peaks S71-S74 and S71'-S74' corresponding to the alignment marks 71 - 74 and 71'-74' as well as the slice level SLC for such alignment signal. The peaks S71-S74 and S71'-S74' will be referred to also as "alignment signals". The voltage comparator 104 binarizes the alignment signals so that pulse signals PLS shown in the part (B) are produced. These pulse signals PLS are applied to a pulse-spacing measuring circuit 107 shown in FIG. 5. Using, as a reference point, the synchronization signal SYNCL of the left-hand side detecting system produced by the synchronization signal detecting circuit 100, the pulse-spacing measuring circuit 107 measures the spacings of the pulse signals PLS by means of reference clocks contained therewithin. More specifically, as illustrated in the part (B) of FIG. 8, the pulse spacing measuring circuit 107 counts clocks from the rise (leading edge) of the synchronization signal SYNCL to the rise (leading edge) and fall (trailing edge) T71R, T71F, T75R, T75F, T72R, T732F, etc. of each of the alignment mark signals S71, S75, S72, etc.

Referring back to FIG. 5, the output pulse signals PLS of the voltage comparator 104 are also supplied to a pulse counting circuit 108. The pulse counting circuit 108 counts the number of pulses and produces an output signal corresponding to the number counted which output signal is applied to the selection signal generating circuit 103. Under the control by the microprocessor 106 and in accordance with the number of pulses counted by the pulse counting circuit 108, the selection signal generating circuit 103 sequentially outputs the selection signals SEL to the signal combining/selecting circuit 102. After completion of the optical scanning by the left-hand side and right-hand side detecting systems, the microprocessor 106 reads out the data T71R, T71F, T75R, T75F, etc. stored in the pulse-spacing measuring circuit 107 and calculates the intervals between the alignment marks and the positional deviation or displacement of the alignment marks relative to each other.

For example, the interval W1 between the marks S71 and S75 can be given by the following equation:

$$W1 = (T75R + T75F)/2 - (T71R + T71F)/2$$

In this manner, the intervals W1, W2, etc. are calculated. When these intervals are calculated, the deviation or displacement between the wafer alignment mark and mask alignment mark can be directly detected in the manner such as disclosed in, e.g., U.S. Patent Application Ser. No. 633,347 filed Jul. 27, 1984.

The signal processing system of FIG. 5 further includes, as another feature thereof, a mode setting means 109 which is adapted to select a desired one or ones of the photoelectric signals obtainable from the light-receiving sections 47A–47D of the four-division detector 47 (or 47'). More specifically, the mode setting means 109 has two important functions; one is for setting the configuration, particularly the sectional shape, of the wafer alignment mark, i.e. whether it comprises the caved pattern or the protrudent pattern; and the other is for setting the number of the light-receiving sections, to be simultaneously selected, of the four light-receiving sections of the photodetector. The mode setting means 109 in this embodiment comprises, such as shown in FIG. 5, a caved pattern designating switch 110A, a protrudent pattern designating switch 110B, a switch 111A for designating selection of one light-receiving section, a switch 111B for designating selection of two light-receiving sections, a switch 11C for designating selection of four light-receiving sections, and a decoder circuit 112. Each of the switches 110A and 110B comprises a two-input/one-selection switch, while each of the switches 111A–111C comprises a three-input/one-selection switch. The information on these switches is encoded by the circuit 112 and is applied to the microprocessor 106. The microprocessor 106 decodes the signal supplied from the mode selecting means 109 to control the selection signal generating circuit 103.

It is now assumed that, in the mode selecting means 109, the caved pattern designating switch 110A and the switch 111A for designating selection of one light-receiving section are selected. When, in FIG. 6, the wafer alignment mark comprises a caved pattern, the alignment signals which having hardly been affected by the prism action of the resist layer are the signal S101C with respect to the mark element 71; the signal S101A with respect to the mark element 72; the signal S101B with respect to the mark element 73; the signal S101D with respect to the mark element 74; the signal S101C' with respect to the mark element 71'; the signal S101A' with respect to the mark element 72'; the signal S101B' with respect to the mark element 73'; and the signal S101D' with respect to the mark element 74'. Accordingly, the order of selection for these signals is from 1 to 8 shown in FIG. 6. Therefore, when in FIG. 7 the optical scanning starts, one end of the analog switch 605 is connected to the data selector 604, and the data selector 604 selects the wafer alignment mark signals of the left-hand side detecting system in the sequence of C, A, B and D (in the named order). When the optical scanning by the left-hand side detecting system is completed and the optical scanning by the right-hand side detecting system starts, the end of the analog switch 605 is connected to the data selector 604', and the data selector 604' selects the wafer alignment mark signals from the right-hand side detecting system in the sequence of C', A', B' D' (in the named order). In this manner, the light-receiving sections of the photodetector are sequentially and selectively used correspondingly to the pulses of alignment signals.

If, on the other hand, the wafer alignment mark comprises a protrudent pattern, the sequence of selection is in the order of A, C, D, B, A', C', D' and B'.

Since the mask alignment mark signals S75, S76, S75' and S76' are not at all affected by the resist layer, selection for the light-receiving sections is not necessary. Therefore, with respect to these signals, the sum "A+B'C+D" and the sum "A'+B'+C'+D'" of the output signals from the four light-receiving sections can always be used.

Another feature of the present invention, i.e. selection of the number of the light-receiving sections to be selected in accordance with the wanted accuracy for the alignment will now be described. The selection of number is carried out by the switches 111A–111C shown in FIG. 5.

The selection of the number of the light-receiving sections is for the purpose of achieving:

(1) Improvements in the position detection efficiency and reduction in the time required for the alignment in a case where not so high accuracy is required for the alignment or where the wafer has a low reflection factor so that the degree of the prism effect of the resist layer is low. In such case, two or four light-receiving sections are selected in order to increase the signal level to thereby improve the position detection efficiency and to achieve reduction in the time required for the alignment.

(2) Improvements in the accuracy of alignment in a case where a high alignment accuracy is required or where the wafer surface is coated with a material of high reflection factor, such as aluminum or the like, so that there occurs a significant prism effect by the presence of the resist layer. In such case, an appropriate one of the light-receiving sections is selected at each moment to detection for the alignment mark to accurately detect the position of the alignment mark to thereby improve the alignment accuracy.

In accordance with the present invention, one of the switches 111A–111C for selecting the number of the light-receiving sections is selected by an operator in accordance with the wanted alignment accuracy.

If, for example, not so high accuracy of alignment is required, the switch 111C which corresponds to an accuracy target 0.5 micron is selected by the operator. When the switch 111C is selected, the information on the selection is transmitted through the decoder circuit 112 to the microprocessor 106. In response thereto, the microprocessor 106 produces an instruction signal for selecting four light-receiving sections which signal is applied to the selection signal generating circuit 103.

When, on the other hand, a high alignment accuracy is required, the switch 111A which corresponds to an accuracy target 0.1 micron is selected. By this, the position detection is carried out by only one light-receiving section at each movement of detection.

In the manner as described above, the number of the light-receiving sections can be selected in accordance with the wanted accuracy. This assures high speed alignment according to the accuracy wanted.

The signal selection relative to the wafer alignment mark signals S71 - S74 and S71'-S74', while taking into account the configuration of the wafer alignment mark and the selected number of the light-receiving elements, as the parameter thereof, can be summarized as shown in the following Table 2 by using reference characters for the signals shown in FIG. 6 i.e. "A", "B", "C", "D", "A+C", "B+D", "A+B+C+D", "A'", "B'", "C'", "D'", "A'+C'", "B'+D'"and "A'+B'+C'+D'". In the following Table 2, the signal selection is made in the order along the downward.

TABLE 2

| | | A.A. MARK | | | | | |
|---|---|---|---|---|---|---|---|
| | | CAVED | | | PROTRUDENT | | |
| SELECTED NUMBER | | 1/4 | 2/4 | 4/4 | 1/4 | 2/4 | 4/4 |
| WAFER | S71 | C | A + C | A + B + C + D | A | A + C | A + B + C + D |
| ALIGNMENT | S72 | A | A + C | A + B + C + D | C | A + C | A + B + C + D |
| SIGNAL | S73 | B | B + D | A + B + C + D | D | B + D | A + B + C + D |
| | S74 | D | B + D | A + B + C + D | B | B + D | A + B + C + D |
| | S71' | C' | A' + C' | A + B + C + D | A' | A' + C' | A + B + C + D |
| | S72' | A' | A' + C' | A + B + C + D | C' | A' + C' | A + B + C + D |
| | S73' | B' | B' + D' | A + B + C + D | D' | B' + D' | A + B + C + D |
| | S74' | D' | B' + D' | A + B + C + D | B' | B' + D' | A + B + C + D |

In accordance with the present invention as has hitherto been described, various advantageous effects are attainable. For example:

(1) High accuracy position detection is assured. This is chiefly because, among the plural light-receiving sections, only one or ones whose signal do not contain unwanted signal components due to the prism effect of the resist layer or the like are selected to obtain the detection signal.

(2) Since appropriate one or ones of the lightreceiving sections which are most suitable for the signal detection corresponding to the configuration of the alignment mark can be selected, high accuracy position detection corresponding to the configuration of the alignment mark is ensured.

(3) Since a desired number of the output signals to be simultaneously selected from those of the plural light-receiving sections can be set, high efficiency and high accuracy position detection is attainable correspondingly to the intensity of the reflected light from the mask and to the required precision. Namely, the number of the light-receiving sections for detecting the wafer alignment mark can be changed in accordance with the accuracy target or the like. If one "1" is selected as the number, appropriate ones of the plural light-receiving sections are sequentially or interchangingly selected, each being best suited to the detection of the wafer alignment mark at a particular moment or instance during the position detection. By this, high-accuracy position detection without being affected by the prism action of the resist layer is assured. Further, when not so high accuracy is required, two "2" or four "4" is selected as the number of the light-receiving sections. In such case, predetermined ones of the plural light-receiving sections are selected at a time and the outputs of these selected light-receiving sections are combined. By this, the position of the wafer alignment mark can be detected in a shorter time period.

(4) Where the light-receiving sections of the photodetector is shaped similarly to the spatial filter, the provision of any specific spatial filter is no longer necessary. Thus, the position detecting device can be of simple structure.

(5) The alignment apparatus for aligning a mask with a wafer and including the position detecting device as has been described in the foregoing assures quick and precise alignment, since the positions of the alignment marks can be detected quickly and accurately so that relative movement to be made between the mask and wafer by an unshown driving mechanism can be determined quickly and precisely.

While the invention has been described with reference to the structures disclosed herein, it is not confined to the details set forth and this application is intended to cover such modifications or changes as may come within the purposes of the improvements or the scope of the following claims.

What is claimed is:

1. A position detecting device for detecting a light beam from a first member having formed thereon a first mark and from a second member having formed thereon a second mark to detect the positional relation between the first and second members, said device comprising:
light-receiving means having a plurality of light-receiving sections for receiving the light beam from the first and second members and for producing output signals representative thereof;
means for counting the number of output signals produced by said light-receiving means; and
means for selecting an appropriate one or ones of said light-receiving sections of said light-receiving means on the basis of the number of output signals counted by said counting means.

2. A position detecting device for detecting a light beam from a first member having formed thereon a first mark and irom a second member having formed thereon a second mark to detect the positional relation between the first and second members, the marks each having one of a plurality of shapes, said device comprising:
light-receiving means having a plurality of light-receiving sections for receiving the light beam from the first and second members;
input means designating the respective one of the plurality of shapes of each mark; and
means for selecting an appropriate one or ones of said light-receiving sections of said light-receiving means on the basis of the designation by said input means.

3. A device for detecting a position of an object having a substantially transparent surface layer by use of a mark formed on the object and formed by one of a recess and a protrusion, said device comprising:
illuminating means for illuminating the object with light, so that light is scatteringly diffracted by the mark, and so that light is reflected by the object and then refracted by the transparent layer;
first detecting means for detecting the light scatteringly diffracted by the mark in a first direction;
second detecting means for detecting the light scatteringly diffracted by the mark in a second direction;
means for designating the configuration of the mark; and
means for selecting, on the basis of the designation by said designating means, one of the outputs of said first and second detecting means that is not influenced by the light reflected by the object and then refracted by the transparent layer.

4. A device according to claim 3, wherein said designating means designates whether the mark is formed by a recess or a protrusion.

5. A device according to claim 4, wherein said illuminating means is adapted to scan the object with the light, wherein the mark formed on the object has first and second edges defined by stepped portions of different configuration with respect to a direction of the scan, and wherein said selecting means selects the output of said first detecting means with respect to the first edge and selects the output of said second detecting means with respect to the second edge when said designating means designates that the mark is provided by a recess, while said selecting means selects the output of said second detecting means with respect to the first edge and selects the output of said first detecting means with respect to the second edge when said designating means designates that the mark is provided by a protrusion.

6. A device according to claim 3, wherein said illuminating means includes an objective lens for directing the light to the object to illuminate the object and wherein each of said first and second detecting means detects the light diffracted by the mark and then passed through said objective lens.

7. A device according to claim 3, further comprising one chip on which said first and second detecting means are disposed in a manner allowing photoelectric detection independently of each dther, said chip being housed in a package having a light-transmitting portion.

* * * * *

UNITED STATES PATENT AND TRADEMARK OFFICE
CERTIFICATE OF CORRECTION

PATENT NO. : 4,663,534  
DATED : May 5, 1987  
INVENTOR(S) : NAOKI AYATA, ET AL.

Page 1 of 3

It is certified that error appears in the above-identified patent and that said Letters Patent is hereby corrected as shown below:

COLUMN 1

Line 14, "tranferring" should read --transferring--.  
Line 52, "lightreceiving" should read --light-receiving--.

COLUMN 2

Line 21, "wafer. FIG. 5A" should read --wafer. ¶ FIG. 5A--.

COLUMN 3

Line 12, "appex" should read --apex--.  
Line 41, "symmetric each" should read --symmetric with each--.

COLUMN 4

Line 28, "lightreceiving" should read --light-receiving--.

COLUMN 6

Line 40, "light-hand" should read --right-hand--.

COLUMN 8

Line 9, "T732F," should read --T72F,--.  
Line 60, "11C" should read --111C--.

UNITED STATES PATENT AND TRADEMARK OFFICE
CERTIFICATE OF CORRECTION

PATENT NO. : 4,663,534

DATED : May 5, 1987

INVENTOR(S) : NAOKI AYATA, ET AL.

It is certified that error appears in the above-identified patent and that said Letters Patent is hereby corrected as shown below:

COLUMN 9

Lines 28-29,   "data ¶ selector" should read --data selector--.

Lines 37-38,   "of ¶ selection" should read --of selection--.

Line 44,   ""A+B'C+D"" should read --"A+B+C+D"--.

COLUMN 10

Line 16,   "to detection" should read --of detection--.

Line 36,   "movement" should read --moment--.

Line 47,   "FIG. 6 i.e." should read --FIG. 6, i.e.,--.

COLUMN 11

Line 7,   "lightreceiv-" should read --light-receiv- --.

UNITED STATES PATENT AND TRADEMARK OFFICE
CERTIFICATE OF CORRECTION

PATENT NO. : 4,663,534                  Page 3 of 3

DATED : May 5, 1987

INVENTOR(S) : NAOKI AYATA, ET AL.

It is certified that error appears in the above-identified patent and that said Letters Patent is hereby corrected as shown below:

COLUMN 12

Line 7,   "irom" should read --from--.
    Line 66,  "dther," should read --other,--.

Signed and Sealed this

Fifteenth Day of September, 1987

Attest:

DONALD J. QUIGG

Attesting Officer          Commissioner of Patents and Trademarks